United States Patent [19]

Nakano

[11] Patent Number: 4,649,289

[45] Date of Patent: Mar. 10, 1987

[54] CIRCUIT FOR MAINTAINING THE POTENTIAL OF A NODE OF A MOS DYNAMIC CIRCUIT

[75] Inventor: Tomio Nakano, Kawasaki, Japan

[73] Assignee: Fujitsu Limited, Kawasaki, Japan

[21] Appl. No.: 682,586

[22] Filed: Dec. 17, 1984

Related U.S. Application Data

[63] Continuation of Ser. No. 240,230, Mar. 3, 1981.

[30] Foreign Application Priority Data

Mar. 3, 1980 [JP]  Japan .................................. 55-26447

[51] Int. Cl.[4] ..................... H03K 3/013; H03K 3/353; H03K 17/10; H03K 17/687
[52] U.S. Cl. .................... 307/246; 307/571; 307/264; 307/270; 307/297; 307/304; 365/203
[58] Field of Search ............... 307/443, 475, 480, 481, 307/482, 200 B, 264, 269, 270, 297, 578, 58, 246, 544–546, 304; 328/172, 173, 176; 365/226, 203

[56] References Cited

U.S. PATENT DOCUMENTS

| | | | |
|---|---|---|---|
| 3,366,889 | 1/1968 | Avins | 307/546 X |
| 3,790,812 | 2/1974 | Fry | 307/246 X |
| 3,805,095 | 4/1974 | Lee et al. | 307/578 X |
| 3,942,047 | 3/1976 | Buchanan | 307/304 X |
| 3,986,044 | 10/1976 | Madland et al. | 307/205 |
| 3,986,049 | 10/1976 | Campbell et al. | 307/546 X |
| 3,995,171 | 11/1976 | Sonoda | 307/270 X |
| 4,029,973 | 6/1977 | Kobayashi et al. | 307/264 |
| 4,229,667 | 10/1980 | Heimbigner et al. | 307/304 X |
| 4,321,489 | 3/1982 | Higuchi et al. | 365/226 X |
| 4,346,310 | 8/1982 | Carter | 307/475 X |
| 4,352,996 | 10/1982 | White, Jr. | 307/578 X |
| 4,377,756 | 3/1983 | Yoshihara et al. | 307/304 X |
| 4,382,194 | 5/1983 | Nakano et al. | 307/264 |
| 4,384,216 | 5/1983 | Pricer | 307/270 |

Primary Examiner—Stanley D. Miller
Assistant Examiner—David R. Bertelson
Attorney, Agent, or Firm—Staas & Halsey

[57] ABSTRACT

A circuit for maintaining the potential of a node of a MOS dynamic circuit using a repetitive charging circuit to hold the potential higher than a source voltage without supplying a steady current to the node. The potential is maintained until a reset signal is applied to the MOS dynamic circuit.

7 Claims, 7 Drawing Figures

CIRCUIT FOR MAINTAINING THE POTENTIAL OF A NODE OF A MOS DYNAMIC CIRCUIT

This is a continuation of co-pending application Ser. No. 240,230 filed on Mar. 3, 1981

BACKGROUND OF THE INVENTION

The present invention relates to a circuit for maintaining the potential of a node point of a MOS dynamic circuit. The circuit of the present invention is applicable to, for example, a dynamic memory circuit.

In general, when a MOS dynamic circuit is used in such a manner that the potential of a node existing in the MOS dynamic circuit is supplied to a load circuit to control the operation of the load circuit, a problem is encountered in that the potential of the node tends to be lowered due to the occurrence of junction leakage current and tailing current in the transistors connected to the node, and, accordingly, the potential of the node against be maintained at a predetermined value. This problem is serious, particularly in the case where the frequency of the operation of the MOS dynamic circuit is low.

The junction leakage current is the leakage current which flows through a PN junction forming the source or drain of the MOS field effect transistors connected to the node. The tailing current is the leakage current which flows through the drain and the source of the transistor connected to the node under the condition that the gate-source voltage of said transistor is lower than the threshold voltage of said transistor.

A prior art circuit for maintaining the potential of a node is illustrated in FIG. 1. In the circuit of FIG. 1, a repetitive charging circuit 4' is connected to the node (ND). The repetitive charging circuit 4' comprises MOD field effect transistor 46 and the drain of the transistor 47 are connected to the supply source voltage $V_{cc}$. The source of the transistor 46 is connected to the source of the transistor 47. The drain of the transistor 46 and the gate of the transistor 47 are connected to one electrode of the capacitor 48. A pumping clock signal 85 is supplied to the other electrode of the capacitor 48.

The repetitive charging circuit 4' of FIG. 1 operates as follows. When the potential of the node (ND) is HIGH and the potential of the signal S5 is LOW, the capacitor 48 is charged by the potential of the node (ND) through the transistor 46 with the voltage "$V_{cc} - V_{th}$", where the $V_{th}$ is the threshold voltage of the transistor 46. After that, when the potential of the signal S5 becomes HIGH, the potential of the gate of the transistor 47 is raised higher than $V_{cc}$ and hence the transistor 47 turns completely ON, and accordingly the node (ND) is charged through the transistor 47 with the voltage $V_{cc}$. At this time the transistor 46 is in an OFF state because the potentials of the source and the drain thereof are higher than the potential of the gate thereof. After that, when the potential of the signal S5 becomes LOW, the capacitor 48 is again charged. Thus, the above described processes re repeated. Only a small output current on the order of a nano-ampere is required of the repetitive charging circuit, because even such a small current is sufficient for compensating the leakage from the node (ND).

However, the prior art circuit of FIG. 1 cannot comply with the requirement that the potential of the node (ND) which is supplied to the load should be maintained higher than $V_{cc}$. Such a requirement arises in the case of, for example, the dynamic memory circuit illustrated in FIG. 2 where the potential of the node of the circuit of FIG. 1 is used as the signal S(pc) which is supplied to the gates of the transistors $Q_4$ and $Q_5$ in the sense amplifier circuit of the dynamic memory circuit. The dynamic memory circuit of FIG. 2 comprises a set of bit lines BL(1) and BL(2), cells and dummy cells connected through transistors $Q_{11}$, $Q_{21}$ to the said bit lines, word lines (WL) and dummy word lines (DWL), a line for the signal S(R) and a sense amplifier circuit including the transistors $Q_1$ and $Q_5$.

In the dynamic memory circuit of FIG. 2, it is required that the potential of the signal S(pc) be higher than $V_{cc}$. Usually the value of $V_{cc}$ is 5 volts and the value of S(pc) is 7 volts.

It has been known that, unless the potential of the signal, S(pc) is maintained at a predetermined value higher than Vcc, the dynamic memory circuit as illustrated in FIG. 2 will not operate correctly. For example, if the potential of the signal S(pc), i.e. the gate potential of the transistors $Q_4$ and $Q_5$, is lowered to $V_{cc} + V_{th}$, where $V_{th}$ is the threshold voltage of the transistors $Q_4$ and $Q_5$, the transistors $Q_4$ and $Q_5$ become OFF so that the bit lines BL(1) and BL(2) may not be shorted through the voltage source $V_{cc}$.

In this state, if junction leakage current flows in the bit line BL(1) due to a small junction defect, the bit line BL(1) has a larger potential decrease than that of the bit line BL(2). Therefore, the potential relationship between the bit lines BL(1) and BL(2) may become the reverse of the correct relationship when the signal S(L) is applied to the gate of the transistor $Q_3$ in the sense amplifier circuit.

Accordingly, there is a problem in that the potential of a predetermined portion of the dynamic memory circuit, such as illustrated in FIG. 2, cannot be maintained by using the prior art circuit of FIG. 1.

The prior art circuit for charging a node in a field effect transistor circuit is disclosed in, for example, the Japanese Patent Application Laid-open No. 54-160139 and the U.S. Pat. No. 3,986,044.

SUMMARY OF THE INVENTION

It is an object of the present invention to solve the above-described problem of the prior art circuit and provide an improved circuit for maintaining the potential of a node.

In accordance with the present invention there is provided a repetitive charging circuit for maintaining the potential of a node of a MOS dynamic circuit. The repetitive charging circuit comprises a device for supplying a charging current to the node from a point the potential of which point is raised higher than the supply source voltage during a predetermined period under the application of a clock signal, whereby the potential of the node is maintained at the predetermined potential higher than the supply source voltage without supplying a steady current to the node until a reset signal is applied to the MOS dynamic circuit.

DESCRIPTION OF THE PREFERRED EMBODIMENTS

Figure 1:
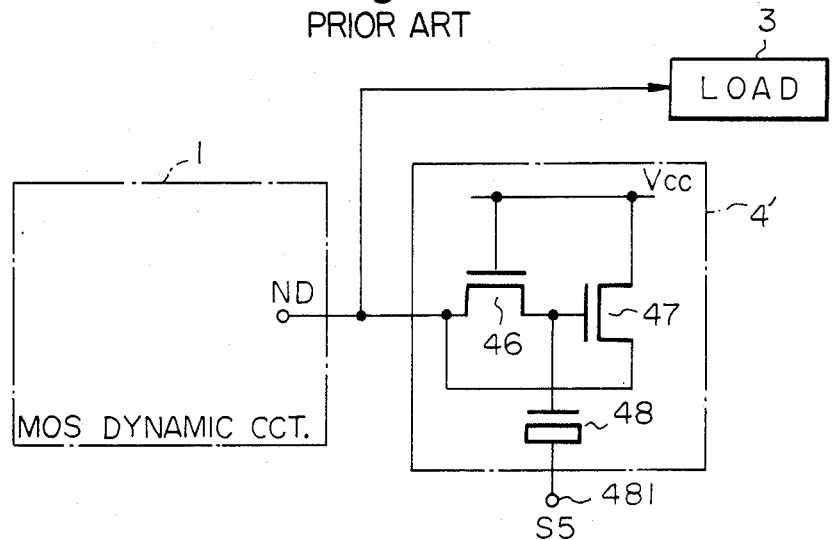
FIG. 1 illustrates the circuit diagram of a prior art circuit for maintaining the potential of a node.
Figure 2:
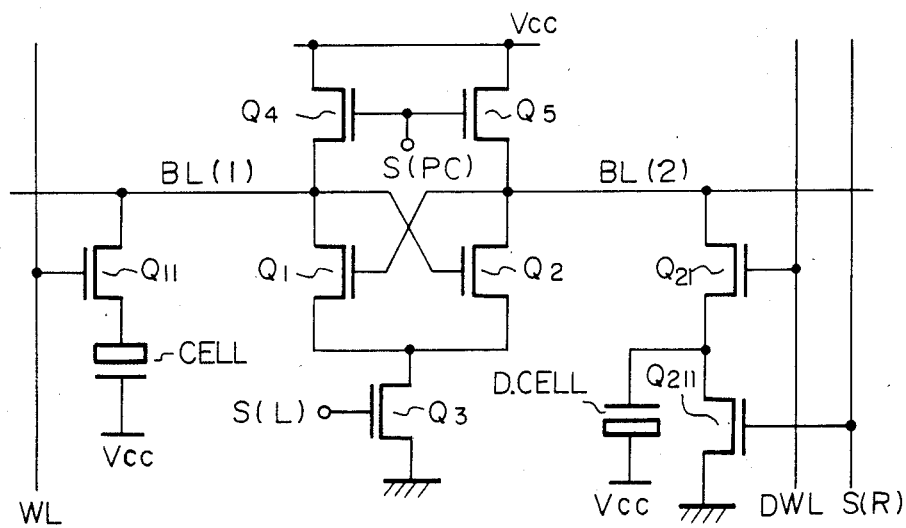
FIG. 2 illustrates a dynamic memory circuit to which the node potential, maintained in accordance with the circuit of the present invention, is to be applied.
Figure 3:
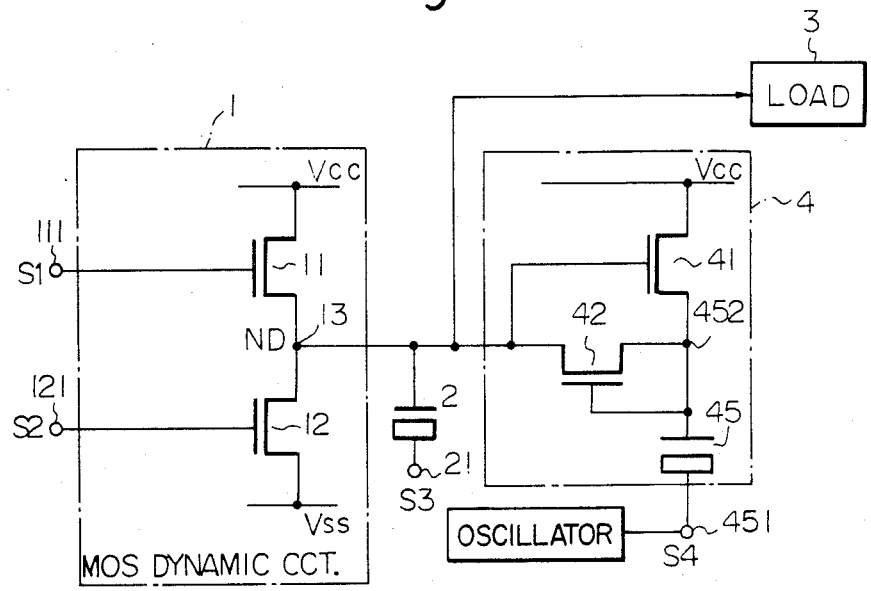
FIG. 3 illustrates the circuit diagram of a circuit for maintaining the potential of a node of a MOS dynamic circuit as an embodiment of the present invention.

A circuit for maintaining the potential of a node as an embodiment of the present invention is illustrated in FIG. 3. The MOS dynamic circuit 1 comprises MOS field effect transistors 11 and 12. The connecting point 13 between the source of the transistor 11 and the drain of the transistor 12 constitutes a node (ND)13. To the gates 111 and 121 of the transistors 11 and 12 clock pulse signals S1 and S2 are supplied to control the transistors 11 and 12 and accordingly to control the potential of the node 13. The signal S1 acts as a setting signal, while the signal S2 acts as a resetting signal.

A load 3, a MOS capacitor 2 and a repetitive charging circuit 4 are connected to the node 13. A clock pulse signal S3 is supplied to one electrode of the capacitor 2. The repetitive charging circuit 4 comprises MOS field effect transistors 41 and 42 and a MOS capacitor 45. The source of the transistor 41 is connected to the drain and the gate of the transistor 42 and one electrode of the capacitor 45. The gate of the transistor 41 and the source of the transistor 42 are connected to he node 13. A clock pulse signal S4 is supplied to the other electrode 451 of the capacitor 45.

Without the repetitive charging circuit 4, the potential $P_{nd}$ of the node 13, which has been brought to HIGH by the input signals S1 and S2, would tend to fall due to the junction leakage current through a PN junction forming the source or drain of the transistors 11 and 12 and the tailing current flowing through the transistor 12.

By the repetitive charging current from the repetitive charging circuit 4, the potential $P_{nd}$ of the node 13 is enhanced higher than the supply source voltage $V_{cc}$ and is maintained at such an enhanced potential. Such an operation will be explained as follows. The MOS capacitor 2 is charged under the condition that the potential $P_{nd}$ of the node 13 is HIGH and the potential of the clock signal S3 is LOW. Then, the potential $P_{nd}$ is raised higher than $V_{cc}$ due to the boot-strap effect of the capacitor 2 when the potential of the clock signal S3 becomes HIGH, because the node 13 is in a floating state.

When the potential $P_{nd}$ becomes HIG, the transistor 41 turns ON and the capacitor 45 is caused to be charged. Under this condition, when the potential of the signal S4 becomes HIGH, the potential of the connecting point 452 between the transistors 41 and 42 and the capacitor 45 attains the value of the sum of the potential of the signal S4 and the voltage of the capacitor 45 which is approximately equal to $V_{cc}$, that is a value greater than $V_{cc}$. Accordingly, the transistor 42 turns ON, and the potential $P_{nd}$ of the node 13 is raised higher than $V_{cc}$. No charging is carried out when the potential $P_{nd}$ of the node 13 is low, because the transistor 41 is in an OFF state then.

The signal S4 may be supplied either from the oscillator, provided outside of the chip on which the MOS dynamic circuit and the repetitive charging circuit are arranged, or from the oscillator included in a substrate bias voltage generator provided on said chip. The cycle time of the signal S4 may be selected as a fraction of the time constant for the discharging of the node 13, for example, on the order of several hundred micro seconds. In the case where the output signal of the oscillator included in the substrate bias voltage generator has a cycle time of two to three hundred nano-seconds, frequency division with the ratio 1000:1 should be effected so as to avoid extra power consumption.

Figure 4:
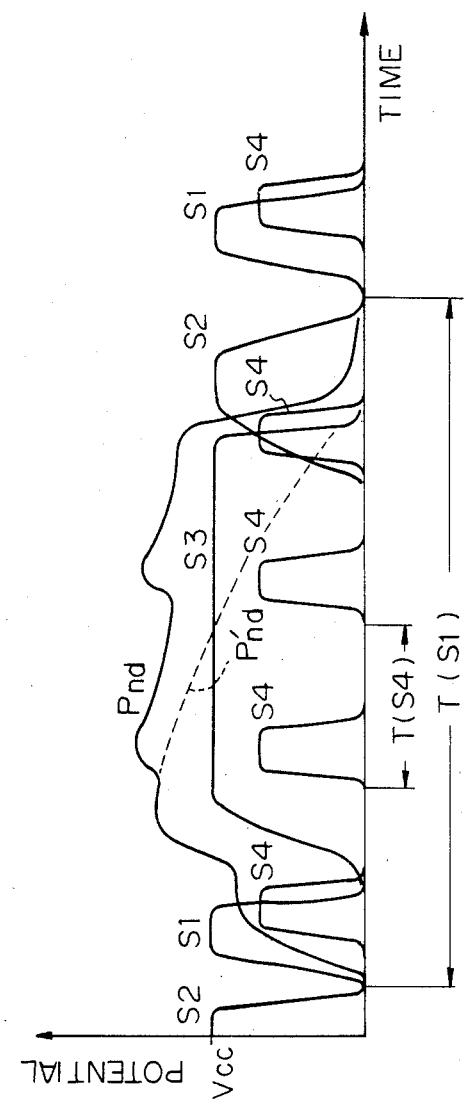
FIG. 4 illustrates the changes of the potentials of the portions of the circuit of FIG. 3.

The changes of the potentials of the portions of the circuit of FIG. 3 are illustrated in FIG. 4. The cycle time of the signal S1 is T(S1) and the cycle time of the signal S4 is T(S4). Comparing the wave form of Pnd with the wave form of P'nd, it is illustrated that the value of Pnd is raised in response to the application of the signal S4. Without the application of the signal S4, the value of $P_{nd}$ would fall as indicated in the broken line P'nd.

Figure 5:
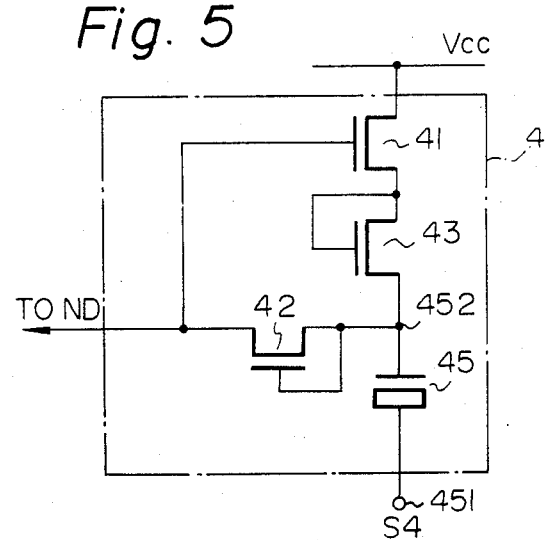
FIGS. 5, 6 and 7 illustrate modified repetitive charging circuits as alternatives for the repetitive charging circuit in FIG. 3.

A modified repetitive charging circuit as an alternative for the circuit 4 of FIG. 3 is illustrated in FIG. 5. In the repetitive charging circuit 4 of FIG. 5 an additional transistor 43 is provided, the drain and the gate of which are connected to the transistor 41 and the source of which is connected to the drain and the gate of the transistor 42 and one electrode of the capacitor 45. The transistor 43 operates to prevent the reverse current from flowing through the transistor 41.

Figure 6:
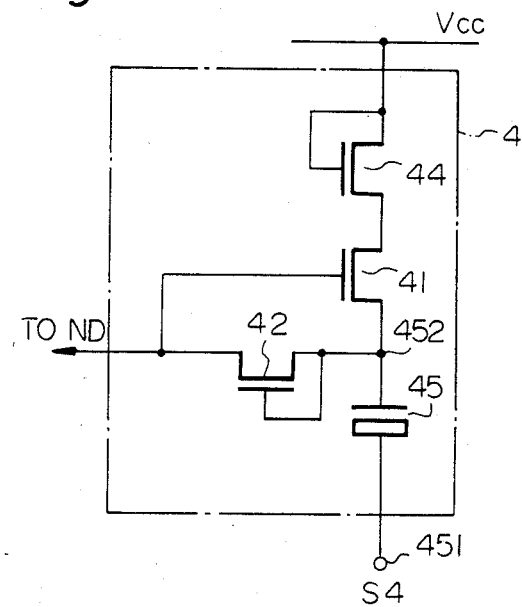

Another modified repetitive charging circuit as an alternative for the circuit 4 of FIG. 3 is illustrated in FIG. 6. In the repetitive charging circuit 4 of FIG. 6 an additional transistor 44 is provided, the drain and the gate of which are connected to the voltage source $V_{cc}$ and the source of which is connected to the drain of the transistor 41. The transistor 44 operates to preventing reverse current from flowing through the transistor 41.

Figure 7:
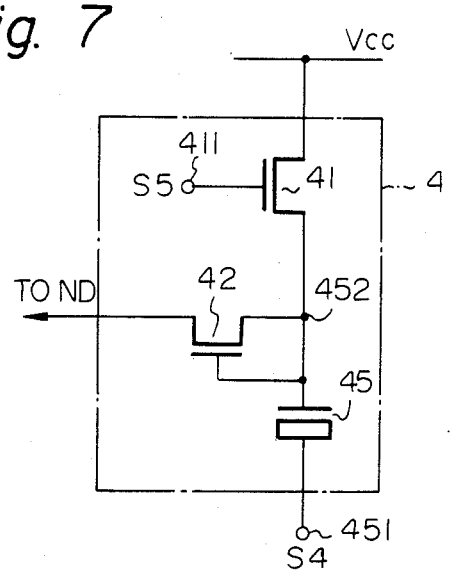

Still another modified repetitive charging circuit as an alternative for the circuit 4 of FIG. 3 is illustrated in FIG. 7. In the repetitive charging circuit 4 of FIG. 7, a clock pulse signal S5 is supplied to the gate 411 of the transistor 41. It is desirable that the clock pulse signal S5 have the same phase relationship as the potential variation of the node ND and have the potential of $V_{cc}$ as the HIGH level so that power consumption of the repetitive charging circuit 4, which would occur when the potential $P_{nd}$ of the node 13 is LOW, is reduced.

I claim:

1. A circuit for maintaining the potential of a node of a MOS dynamic circuit comprising a repetitive charging circuit operatively connected to said node, said repetitive charging circuit comprising:

a first connecting point;

first means, operatively connected to said first connecting point, for receiving a supply source voltage and repetitively charging said first connecting point while the potential of said node is higher than a predetermined potential, said first means comprising a MOS field effect transistor having a first electrode operatively connected to the supply source voltage point, a second electrode operatively connected to said first connecting point and a gate electrode operatively connected to said node; and second means, operatively connected to said node and said first connecting point and operatively connected to receive a repetitive clock signal, for repetitively supplying a charging current to said node from the first connecting point in correspondence with the repetitive clock signal to maintain the potential of said node at a potential higher than the supply source voltage, said first means being responsive to the potential of said node and being cut off to stop charging while the potential of said node is lower than said predetermined potential irrespective of application of said repetitive clock signal.

2. A circuit for maintaining the potential of a node of a MOS dynamic circuit comprising a repetitive charging circuit operatively connected to said node, said repetitive charging circuit comprising:
a first connecting point;
first means, operatively connected to said first connecting point, for receiving a supply source voltage and repetitively charging said first connecting point while the potential of said node is higher than a predetermined potential; and
second means operatively connected to said node and said first connecting point and operatively connected to receive a repetitive clock signal, for repetitively supplying a charging current to said node from the first connecting point in correspondence with the repetitive clock signal to maintain the potential of said node at a potential higher than the supply source voltage, said first means being responsive to the potential of said node and being cut off to stop charging while the potential of said node is lower than said predetermined potential, irrespective of application of said repetitive clock signal, said second means comprising:
a first MOS field effect transistor having a first electrode operatively connected to said node of said MOS dynamic circuit, and having a second electrode and a gate electrode connected to the first connecting point; and
a MOS capacitor operatively connected to said first MOS field effect transistor and the first connecting point, and having a first electrode, the first connecting point being formed at a connecting point of the second electrode and the gate electrode of said MOS field effect transistor and the first electrode of said MOS capacitor; and
a supply source voltage point and said first means comprising a second MOS field effect transistor having a first electrode operatively connected to the supply source voltage point, a second electrode operatively connected to said first connecting point and a gate electrode operatively connected to said node.

3. A circuit for maintaining the potential of a node of a MOS dynamic circuit comprising a repetitive charging circuit operatively connected to said node, said repetitive charging circuit comprising:
a first connecting point;
first means, operatively connected to said first connecting point, for receiving a supply source voltage and repetitively charging said first connecting point while the potential of said node is higher than a predetermined potential; and
second means, operatively connected to said node and said first connecting point and operatively connected to receive a repetitive clock signal, for repetitively supplying a charging current to said node from the first connecting point in correspondence with the repetitive clock signal to maintain the potential of said node at a potential higher than the supply source voltage, said first means being responsive to the potential of said node and being cut off to stop charging while the potential of said node is lower than said predetermined potential irrespective of application of said repetitive clock signal, said second means comprising:
a first MOS field effect transistor having a first electrode operatively connected to said node of said MOS dynamic circuit, and having a second electrode and a gate electrode connected to the first connecting point; and
a MOS capacitor operatively connected to said first MOS field effect transistor and the first connecting point, and having a first electrode, the first connecting point being formed at a connecting point of the second electrode and the gate electrode of said MOS field effect transistor and the first electrode of said MOS capacitor and having a second electrode;
means for generating a clock signal operatively connected to the second electrode of said MOS capacitor; and
a supply source voltage point and said first means comprising a second MOS field effect transistor having a first electrode operatively connected to the supply source voltage point, a second electrode operatively connected to said first connecting point and a gate electrode operatively connected to said node 4. A circuit for maintaining the potential of a node of a MOS dynamic circuit comprising a repetitive charging circuit operatively connected to said node, said repetitive charging circuit comprising:
a first connecting point;
first means, operatively connected to said first connecting point, for receiving a supply source voltage and repetitively charging said first connecting point in response to the potential of said node, said first means being cut off to stop charging said first connecting point when the potential of said node is lower than a predetermined level;
second means, operatively connected to said node and said first connecting point, for supplying a charging current ot said node from the first connecting point when said first connecting point has been charged up by said first means to maintain the potential of said node at a level higher than the supply source voltage until a reset signal is applied to said MOS dynamic circuit, said second means for supplying a charging current to said node comprising:
a MOS field effect transistor having a first electrode operatively connected to said node of said MOS dynamic circuit, and having a second electrode and a gate electrode connected to the first connecting point; and
a MOS capacitor having a first electrode connected to the first connecting point;
a supply source voltage point;
means for providng a clock pulse signal; and
said first means comprising a MOS field effect transistor having a first electrode operatively connected to the supply source voltage point, a second electrode operatively connected to said first connecting point and a gate electrode operatively connected to said means for providing.

5. A circuit for maintaining the potential of a node of a MOS dynamic circuit comprising a repetitive charging circuit operatively connected to said node, said repetitive charging circuit comprising:
a first connecting point;
first means, operatively connected to said first connecting point, for receiving a supply source voltage and charging said first connecting point in response to the potential of said node, said first means being cut off to stop charging said first connecting point when the potential of said node is lower than a predetermined level;
second means, operatively connected to said node and said first connecting point, for supplying a charging current to said node from the first connecting point when said first connecting point has been charged up by said first means to maintain the potential of said node at a level higher than the supply source voltage until a reset signal is applied to said MOS dynamic circuit, said second means for supplying a charging current to said node comprising:
a MOS field effect transistor having a first electrode operatively connected to said node of said MOS dynamic circuit, and having a second electrode and a gate electrode connected to the first connecting point; and
a MOS capacitor having first and second electrodes, the first electrode being connected to the first connecting point; and
means for generating a clock signal operatively connected to the second electrode of said MOS capacitor, where said means for generating a clock signal comprises a substrate bias voltage generator having an oscillator operatively connected to the second electrode of said capacitor and producing a frequency divided signal which is supplied to the second electrode of said capacitor and has a cycle time which is a fraction of the time constant associated with the discharging of said node, where said generator, said MOS dynamic circuit and said repetitive charging circuit are formed on a chip, and said clock signal is generated by the oscillator included in the substrate ias voltage generator provided on the chip on which said MOS dynamic circuit and said repetitive charging circuit are formed.

6. A circuit for maintaining the potential of a node of a MOS dynamic circuit comprising a repetitive charging circuit operatively connected to said node, said repetitive charging circuit comprising;
a first connecting point;
first means, operatively connected to said first connecting point, for receiving a supply source voltage and repetitively charging said first connecting point in response to the potential of said node, said first means being cut off to stop charging said first connecting point when the potential of said node is lower than a predetermined level;
second means, operatively connected to said node and said first connecting point, for supplying a charging current to said node from the first connection point when said first connecting pont has been charged up by said first means to maintain the potential of said node at a level higher than the supply source voltage until a reset signal is applied to said MOS dynamic circuit, said second means for supplying a charging current to said node comprising:
a MOS field effect transistor having a first electrode operatively connected to said node of said MOS dynamic circuit, and having a second electrode and a gate electrode connected to the first connecting point; and
a MOS capacitor having a first electrode connected to the first connecting point; and
means for providing a clock pulse signal to said first means for controlling same.

7. A circuit for maintaining the potential of a node of a MOS dynamic circuit, comprising:
a first MOS transistor operatively connected between a power supply point and a connecting point and having a gate;
a MOS capacitor operatively connected to the connecting point;
a second MOS transistor operatively connected between the connecting point and the node; and
means, operatively connected to the gate of said first MOS transistor, for providing a clock pulse signal to control said first MOS transistor, said first MOS transistor repetitively charging the connecting point only while a potential of the gate is higher than a potential of the power supply point.

* * * * *

UNITED STATES PATENT AND TRADEMARK OFFICE
CERTIFICATE OF CORRECTION

PATENT NO. : 4,649,289

DATED : March 10, 1987

INVENTOR(S) : Nakano

It is certified that error appears in the above-identified patent and that said Letters Patent is hereby corrected as shown below:

```
Column 1, line 37, "MOD" should be --MOS--; after "and" insert
          --47 and MOS capacitor 48. The gate of the transistor
          46 and--;
          line 43, "85" should be --S5--;
          line 60, "re" should be --are--.
Column 2, line 11, "and" should be --through--.
Column 3, line 5, "and;" should be --and--;
          line 31, "he" should be --the--.
Column 6, line 44, "ot" should be --to--.
Column 7, line 44, "ias" should be --bias--.
Column 8, line 16, "pont" should be --point--.
```

Signed and Sealed this

Eighteenth Day of August, 1987

Attest:

DONALD J. QUIGG

Attesting Officer    Commissioner of Patents and Trademarks